United States Patent [19]

Kato et al.

[11] Patent Number: 4,962,485
[45] Date of Patent: Oct. 9, 1990

[54] NONCONTACTING IC CARD SUPPLIED WITH POWER FROM AN OUTSIDE SOURCE

[75] Inventors: Yoshiaki Kato, Tanashi; Harumi Yuyama, Yamanahi; Tutomu Ojima, Mizusawa; Hiromi Ishikawa, Morioka, all of Japan

[73] Assignee: Citizen Watch Co., Ltd., Tokyo, Japan

[21] Appl. No.: 309,880

[22] Filed: Feb. 14, 1989

[30] Foreign Application Priority Data

Feb. 16, 1988 [JP] Japan .............................. 63-19061[U]

[51] Int. Cl.⁵ ............................................... G11C 7/00
[52] U.S. Cl. .................................................... 365/229
[58] Field of Search ................................. 365/228, 229

[56] References Cited

U.S. PATENT DOCUMENTS

| | | | |
|---|---|---|---|
| 4,547,629 | 10/1985 | Corless | 365/229 |
| 4,777,626 | 10/1988 | Matsushita et al. | 365/229 |
| 4,818,891 | 4/1989 | Drinkwater | 365/229 |
| 4,855,994 | 8/1989 | Takeuchi et al. | 365/189.12 |

Primary Examiner—James W. Moffitt

[57] ABSTRACT

An IC card such as cash card is disclosed. The IC card has a RAM, a control circuit for controlling access to the RAM, and a power supply circuit receiving outside energy and supplying power to the RAM and the control circuit. A first voltage detector produces a starting output when supply voltage of the power exceeds a predetermined first reference voltage. A second voltage detector produces a control signal when the supply voltage exceeds a predetermined second reference voltage, which is higher than the first reference voltage. An AND gate is provided to produce a RAM control signal for operating the RAM when the starting signal and the control signal are applied thereto.

12 Claims, 4 Drawing Sheets

NONCONTACTING IC CARD SUPPLIED WITH POWER FROM AN OUTSIDE SOURCE

BACKGROUND OF THE INVENTION

The present invention relates to an integrated circuit (IC) card and more particularly to a noncontacting IC card.

Since the noncontacting IC card does not contain base electric contacts, it is suitable for a card for controlling a machine tool which splashes a coolant. The IC card is inserted into a reader/writer so that data stored in a random access memory (RAM) in the IC card can be read out or rewritten.

FIG. 5 shows an electronic circuit of a conventional noncontacting IC card. The circuit comprises a control circuit 1 which is an IC having a central processing unit (CPU) and read-only memory (ROM); a random access memory (RAM) 2 which is a memory IC; a power supply circuit 200; and a voltage detector 3. The power supply circuit 200 receives electromagnetic energy from a reader/writer 100 (FIG. 6), for producing power $V_{DD}$. The voltage detector 3 detects the voltage of the power $V_{DD}$ generated from the power supply circuit 200. The electronic circuit of the noncontacting IC card 10 is tightly sealed by an external member of the card so as to be prevented from being affected by atmosphere and dust.

The control circuit 1 is provided with a crystal oscillator 11, capacitors 12, 13 and a CPU. The CPU controls various signals, synchronizing the signals with a clock signal generated by an oscillator provided therein. The RAM 2 has a plurality of memory elements and is applied with access signals, address signals from the control circuit 1 through leads 15 and 16 so as to be activated. Data signals are communicated between the RAM 2 and the control circuit 1 through leads 18.

A backup battery 6 is provided for holding data in the RAM 2 when the IC card is detached from the reader/writer 100. The backup battery 6 is connected to a $V_{DD}$ terminal of the RAM with a $V_{DD}$ circuit having inverse current preventing diodes 7 and 8.

As shown in FIG. 2, the voltage detector 3 comprises a comparator 32, a zener diode 33 and resistors. The comparator 32 is supplied with the voltage $V_{DD}$ from the power supply circuit 200 and produces a signal when the voltage is higher than a predetermined reference voltage. The signal is applied to the control circuit 1 through a lead 31 to release the reset state of the control circuit to start a program.

Referring to FIG. 6, the power supply circuit 200 is provided with coil 201, rectifier diode 202 and smoothing capacitor 203.

In operation, when the IC card 10 is inserted into the reader/writer 100, a coil 101 of the reader/writer 100 generates an alternating magnetic field, and the coil 201 of the IC card receives electromagnetic energy to produce an alternating current. The alternating current is smoothed by the rectifier diode 202. The capacitor 203 is charged with the voltage of the smoothed current and the charged voltage is applied to necessary circuits and devices of the IC card as supply voltage $V_{DD}$.

When the voltage at the $V_{DD}$ terminal of the voltage detector increases from zero to a reference voltage, the control circuit 1 is set so as to start the program.

The control circuit 1 sends a signal to a modulator circuit 301 through a lead 300. The signal is modulated and fed to a transmitter coil 302, thereby applying data stored in the RAM 2 to the reader/writer 100. On the other hand, a signal from the reader/writer 100 is fed to a detector 401 through a receiving coil 402. The signal is detected and applied to the control circuit 1 through a lead 400.

FIG. 3 shows the change of the voltage $V_{DD}$ when the IC card is inserted into the reader/writer and removed therefrom. The voltage increases to a final maximum voltage E with time.

In general, it takes from several machine cycles to several hundred machine cycles for the supply voltage to reach a sufficient voltage for stabilizing the program operation. Accordingly, while the supply voltage is increased or decreased, the control signal for the RAM 2 is unstable to supply an erroneous control signal to the RAM. This may cause contents of data in the RAM 2 to change.

SUMMARY OF THE INVENTION

The object of the present invention is to provide an IC card where data in a RAM can be securely protected.

In the IC card of the present invention, the control signal is applied to the RAM when the supply voltage achieves a sufficient value for stabilizing the program operation.

According to the present invention, there is provided an IC card having a RAM; a control circuit for controlling access to the RAM; a power supply circuit receiving outside energy and converting it to electric energy to supply power to the RAM and the control circuit; a backup battery for holding data stored in the RAM; and input/output device for a reader/writer.

The IC card includes a first voltage detector connected to the power supply circuit and arranged to produce a starting output for starting the control circuit when supply voltage of the power exceeds a predetermined first reference voltage. It further includes a voltage detector connected to the power supply circuit and arranged to produce a control signal when the supply voltage exceeds a predetermined second reference voltage which is higher than the first reference voltage. Finally, a gate device is included, responsive to the starting signal and to the control signal for producing a RAM control signal for operating the RAM.

In one embodiment of the present invention, each of the voltage detectors includes a comparator for comparing the supply voltage with the reference voltage, and the gate device is an AND gate.

Other objects and features of the present invention will become more apparent from the following detailed description with reference to the accompanying drawings.

DETAILED DESCRIPTION OF THE PREFERRED EMBODIMENT

Figure 1:
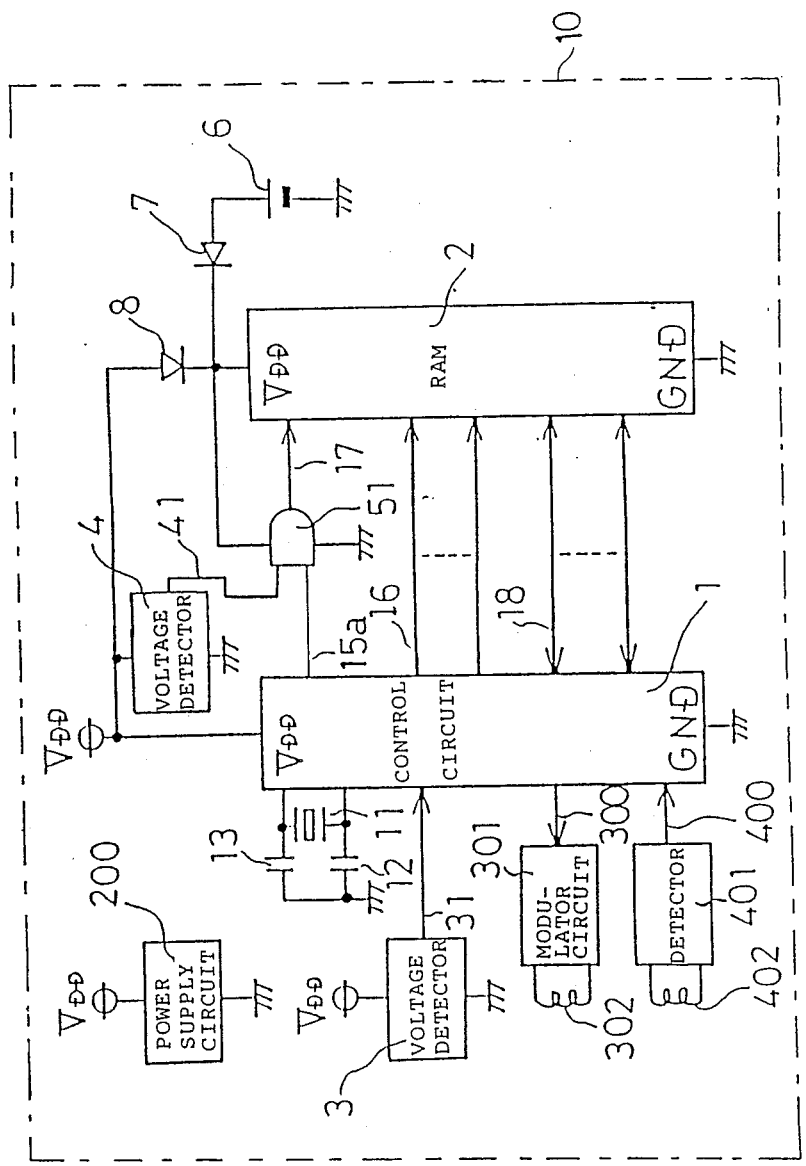
FIG. 1 is a block diagram of an electronic circuit provided in an IC card of the present invention.
Figure 5:
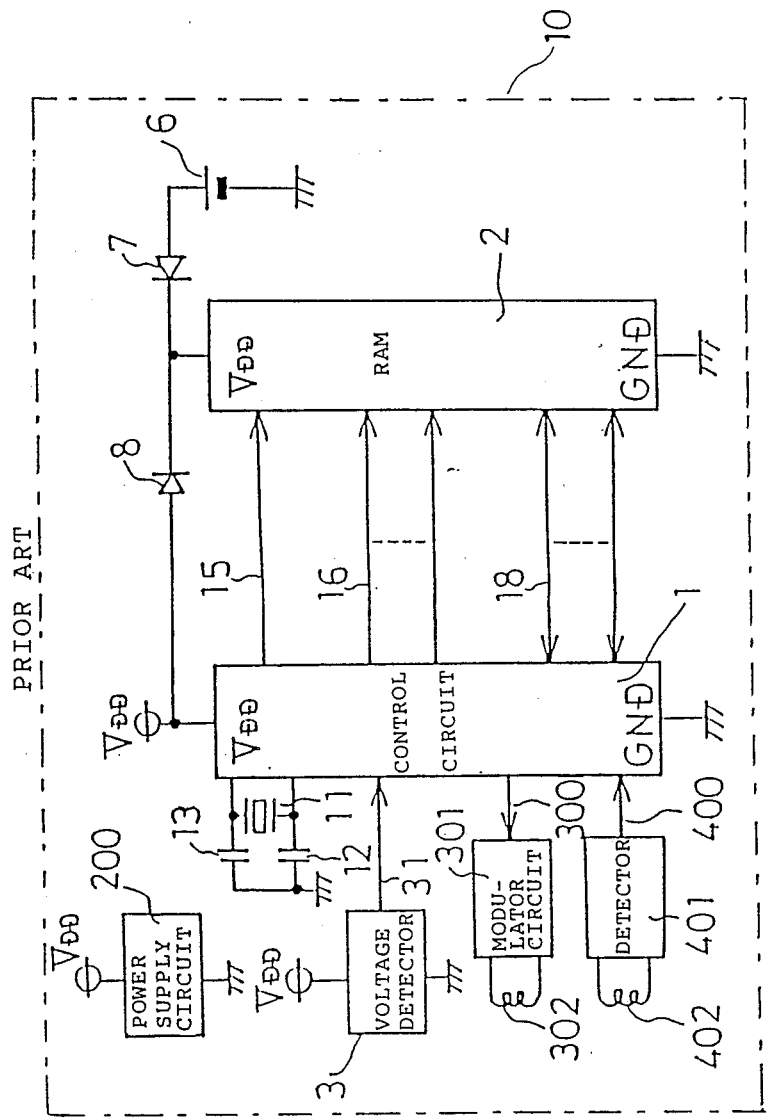
FIG. 5 is a block diagram of an electronic circuit provided in a conventional IC card.

Referring to FIG. 1, a construction of an electronic circuit provided in an IC card of the present invention is similar to that of the conventional IC card shown in FIG. 5. The same parts in FIG. 1 are identified by the same reference numbers as those in FIG. 5.

Figure 2:
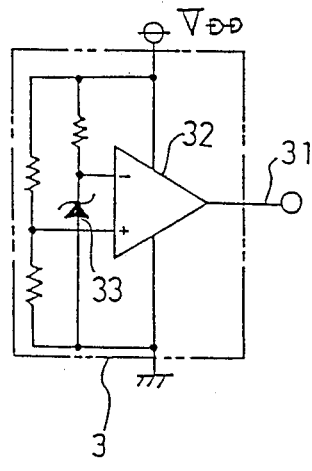
FIG. 2 is a block diagram of a voltage detector.
Figure 4:
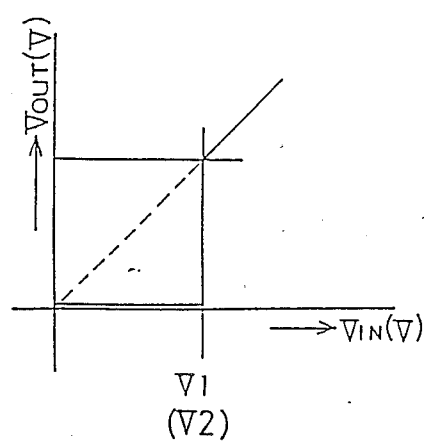
FIG. 4 is a graph showing a relationship between input voltage and output voltage of the voltage detector.

In addition to the components in FIG. 5, a second voltage detector 4 and an AND gate 51 as a gate device are provided. The second voltage detector 4 is constructed in a same manner as the first voltage detector 3 shown in FIG. 2. Reference voltages of the first and second voltage detectors 3 and 4 are $V_1$ and $V_2$, (FIG. 3) respectively. The relationship among the voltages are expressed as $V_1 < V_2 < E$. As shown in FIG. 4, when an input voltage $V_{IN}$ of the first voltage detector 3 is lower than than the reference voltage $V_1$, an output voltage $V_{OUT}$ is zero. When the input voltage $V_{IN}$ exceeds the voltage $V_1$, the detector 3 produces the output voltage $V_{OUT}$ having the same value as the input voltage $V_{IN}$. The second voltage detector 4 operates in the same manner as the first voltage detector 3 with respect to the reference voltage $V_2$.

An output signal of the second voltage detector 4 is fed to one of the input terminals of the AND gate 51 through a lead 41. The other input of the AND gate 51 is fed with the RAM access signal from the control circuit 1 through a lead 15a. The RAM access signal is further fed to the RAM 2 through a lead 17 when a high level signal is applied to the AND gate 51 from the second voltage detector 4.

Figure 3:
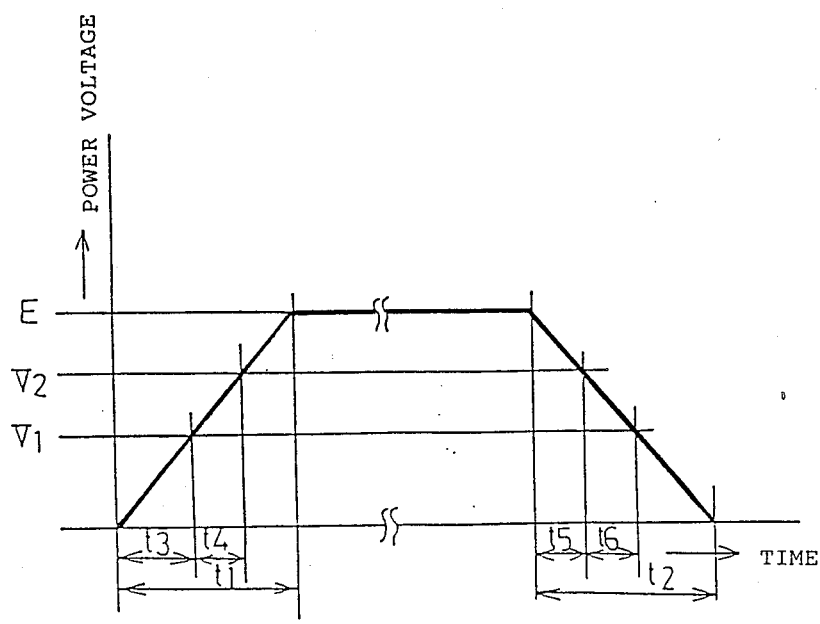
FIG. 3 is a graph describing change of supply voltage with time.
Figure 6:
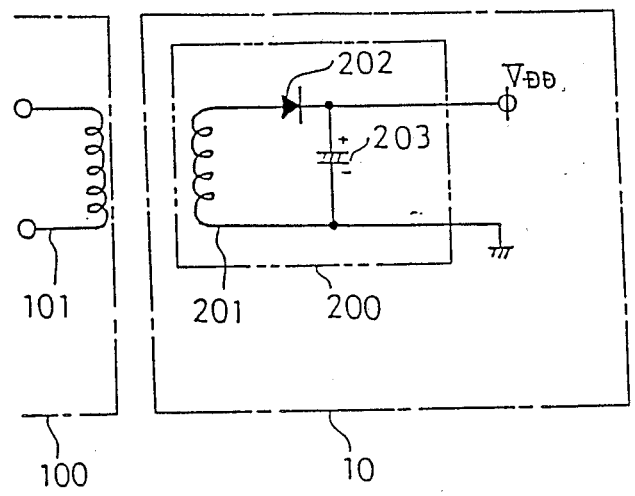
FIG. 6 is a block diagram of a power supply circuit provided in the electronic circuit shown in FIG. 5.

The operation of the present invention will be described hereinafter with reference to FIGS. 3 and 6. When the IC card is attached to the reader/writer 100, the coil 201 of the power supply circuit 200 receives electromagnetic energy through the coil 101 to generate alternating current. The alternating current is rectified by the diode 202 and the rectified current is charged in the capacitor 203. When the charged voltage exceeds the reference voltage $V_1$ after a time $t_3$, the first voltage detector 3 is actuated to set the control unit 1, thereby starting a program. Since the second voltage detector 4 does not produce a high level signal at that time, the AND gate does not produce an output.

When the supply voltage becomes higher than the reference voltage $V_2$ after a time $t_4$, the second voltage detector 4 feeds a high level signal as a RAM control signal to the AND gate 51. Thus, the AND gate 51 produces an output signal as an access signal. Thus, the RAM access signal is applied to the RAM 2. The supply voltage further increases until it reaches the final voltage E after a time $t_1$.

When the IC card is detached from the reader/writer 100, the supply voltage decreases. Thus, the voltage becomes lower than the reference voltage $V_2$ after a time $t_5$. Thus, the second voltage detector 4 produces a low level output, thereby deactivating the AND gate 51. Accordingly, access to the RAM 2 is inhibited. When the voltage decreases under the reference voltage $V_1$ after a time $t_6$, the first voltage detector 3 operates to reset the control circuit 1. The supply voltage becomes zero after a time $t_2$ from the time the card is detached.

The lengths of time $t_1$ to $t_6$ can be changed by changing the constant of the smoothing capacitor 203 in the power supply circuit 200. In the circuit, time $t_1$ and time $t_2$ are substantially the same length. The time $t_4$ during which the supply voltage increases from $V_1$ to $V_2$ must be much longer than a time within which the operation of the control circuit becomes stable, which is in the range of several machine cycles to several hundred machine cycles. The constant of the smoothing capacitor is so determined as to render the time $t_4$ longer than ten times several hundred machine cycles accordingly.

From the foregoing, it will be understood that the present invention provides a highly reliable IC card where an erroneous access to a RAM is prevented to protect memory data because the control circuit and the RAM are controlled to operate in predetermined order in accordance with output signals of the voltage detectors.

While the invention has been described in conjunction with preferred specific embodiment thereof, it will be understood that this description is intended to illustrate and not limit the scope of the invention, which is defined by the following claims.

What is claimed is:

1. A non-contact IC card having a RAM, a control circuit for controlling access to the RAM, a power supply circuit, for electro-magnetic non-contact connection to an outside source for receiving outside energy and converting it to electric energy to supply power to the RAM and the control circuit, a backup battery for maintaining data stored in the RAM, and input/output device for a reader/writer, comprising:

first voltage detection means, connected to the power supply circuit, for producing a starting signal for starting the control circuit when supply voltage from said power supply circuit exceeds a predetermined first reference voltage;

second voltage detection means, connected to the power supply circuit, for producing a control signal when the supply voltage from the power supply circuit exceeds a predetermined second reference voltage, which is greater than the predetermined first reference voltage;

gate means, responsive to both the starting signal and the control signal, for producing a RAM control signal for operating the RAM.

2. The IC card according to claim 1 wherein each of first and second voltage detection means comprises a comparison means for comparing the supply voltage with a predetermined reference voltage.

3. The IC card according to claim 1 wherein the gate means is an AND gate.

4. A non-contact IC card having a RAM, a control circuit producing an access signal for operating the RAM, and a backup battery for maintaining data stored in the RAM, comprising:

power supply means, including a coil electromagnetically connected to a coil of an outside reader/writer, for producing an alternating current from said outside reader/writer and for converting the alternating current to a direct current thereby creating an input supply voltage;

first voltage detection means, connected to the power supply means, for producing a starting signal for starting operation of the control circuit when the input supply voltage exceeds a predetermined first reference voltage;

second voltage detection means, connected to the power supply means, for producing a control signal when the supply voltage exceeds a predetermined second reference voltage, which is greater than the first reference voltage;

gate means, connected to the control circuit and the RAM, for producing a RAM control signal to operate and access the RAM in response to both said starting signal and said control signal.

5. The IC card of claim 4, further comprising:
current supply circuit having a first diode connected to the backup battery and a second diode connected to the output of the power supply means, the diodes being further connected to the gate means and the RAM for controlling operation thereof.

6. The IC card of claim 4, further comprising:
transmitter coil, connected to said RAM, for applying data stored in the RAM to the reader/writer during a read operation; and
receiving coil, connected to said RAM, for receiving data from the reader/writer to the RAM during a write operation.

7. A non-contact IC card for electromagnetic connection to an external read and write device, comprising:
memory means, for storing data written from said external read and write device for outputting data read by said external read and write device;
power supply means, electromagnetically connected to said external read and write device, for receiving a signal from said external read and write device and outputting a corresponding supply voltage;
first detection means, operatively connected to said power supply means, for receiving said output supply voltage and for outputting a first control signal upon said output supply voltage exceeding a first predetermined threshold;
control means, operatively connected to said first detection means for outputting a second control signal, said second control signal being output upon receiving said first control signal from said first detection means;
second detection means, operatively connected to said power supply means, for receiving said output supply voltage and for outputting a third control signal upon said output supply voltage exceeding a second predetermined threshold greater than said first predetermined threshold; and
gate means, operatively connected to said control means, memory means, and second detection means, for outputting a memory access signal to said memory means to allow writing of data from said external read and write device to said memory means and reading of data by said external read and write device from said memory means, said memory access signal being output upon said gate means receiving both said second and third control signals.

8. The non-contact I.C. card of claim 7, wherein said second control signal output by said control means is a signal corresponding to a program for reading and writing data to and from said memory means.

9. The non-contact IC of claim 7, wherein said gate means is an AND gate.

10. A method of reading data from and writing data to a non-contact I.C. card, to and from an electromagnetically connected external read and write device, respectively, the method comprising the steps of:
(a) receiving a signal from the external read and write device and supplying a supply voltage to the I.C. card;
(b) detecting the supply voltage and outputting a first control signal upon the supply voltage exceeding a first predetermined value;
(c) outputting a second control signal upon receiving the first control signal;
(d) detecting the supply voltage and outputting a third control signal upon the supply voltage exceeding a second predetermined value greater than the first predetermined value; and
(e) outputting a memory access signal to allow writing of data from the external read and write device to the I.C. card and reading of data by the external read and write device from the I.C. card, the memory access signal being output upon detecting that both the second and third control signals have been output.

11. The method of claim 10, wherein the second contact signal is a signal corresponding to a program within the I.C. card for reading and writing of data.

12. The method of claim 10, wherein a memory within the IC card stores data written from the external read and write device and data read by the external read and write device.

* * * * *